(12) United States Patent
Koga et al.

(10) Patent No.: US 11,061,335 B2
(45) Date of Patent: Jul. 13, 2021

(54) INFORMATION PROCESSING APPARATUS, STORAGE MEDIUM, LITHOGRAPHY APPARATUS, LITHOGRAPHY SYSTEM, AND ARTICLE MANUFACTURING METHOD

(71) Applicant: CANON KABUSHIKI KAISHA, Tokyo (JP)

(72) Inventors: Shinichiro Koga, Utsunomiya (JP); Noburu Takakura, Utsunomiya (JP); Takahiro Takiguchi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/451,727

(22) Filed: Jun. 25, 2019

(65) Prior Publication Data
US 2020/0004158 A1    Jan. 2, 2020

(30) Foreign Application Priority Data

Jun. 29, 2018  (JP) .............................. JP2018-125523
May 23, 2019  (JP) .............................. JP2019-097148

(51) Int. Cl.
*G03F 7/20*    (2006.01)
*G03F 9/00*    (2006.01)

(52) U.S. Cl.
CPC ............ *G03F 7/705* (2013.01); *G03F 7/7035* (2013.01); *G03F 7/70483* (2013.01); *G03F 7/70616* (2013.01); *G03F 7/70625* (2013.01); *G03F 7/70633* (2013.01); *G03F 9/7038* (2013.01); *G03F 9/7042* (2013.01)

(58) Field of Classification Search
CPC .. G03F 7/0002; G03F 7/7035; G03F 7/70483; G03F 7/705; G03F 7/70616; G03F 7/70625; G03F 7/70633; G03F 9/7038; G03F 9/7042
USPC ..................................................... 355/52, 78
See application file for complete search history.

(56) References Cited

U.S. PATENT DOCUMENTS

2020/0249576 A1*   8/2020   Warnaar .............. G03F 7/70633

FOREIGN PATENT DOCUMENTS

JP              3637041 B2      4/2005

* cited by examiner

*Primary Examiner* — Colin W Kreutzer
(74) *Attorney, Agent, or Firm* — Canon U.S.A., Inc. IP Division

(57) ABSTRACT

An information processing apparatus for acquiring an inspection condition for performing an inspection on a pattern formed by a lithography apparatus that forms a pattern on a substrate with an original includes an acquisition unit configured to acquire a second inspection condition to be applied in a case where an inspection is performed on a second pattern by inputting third information indicating a state of the lithography apparatus acquired when the second pattern is formed to a model, wherein the model is acquired by machine learning with learning data including first information indicating a state of the lithography apparatus acquired when a first pattern is formed and second information indicating a first inspection condition applied when an inspection is performed on the first pattern.

27 Claims, 10 Drawing Sheets

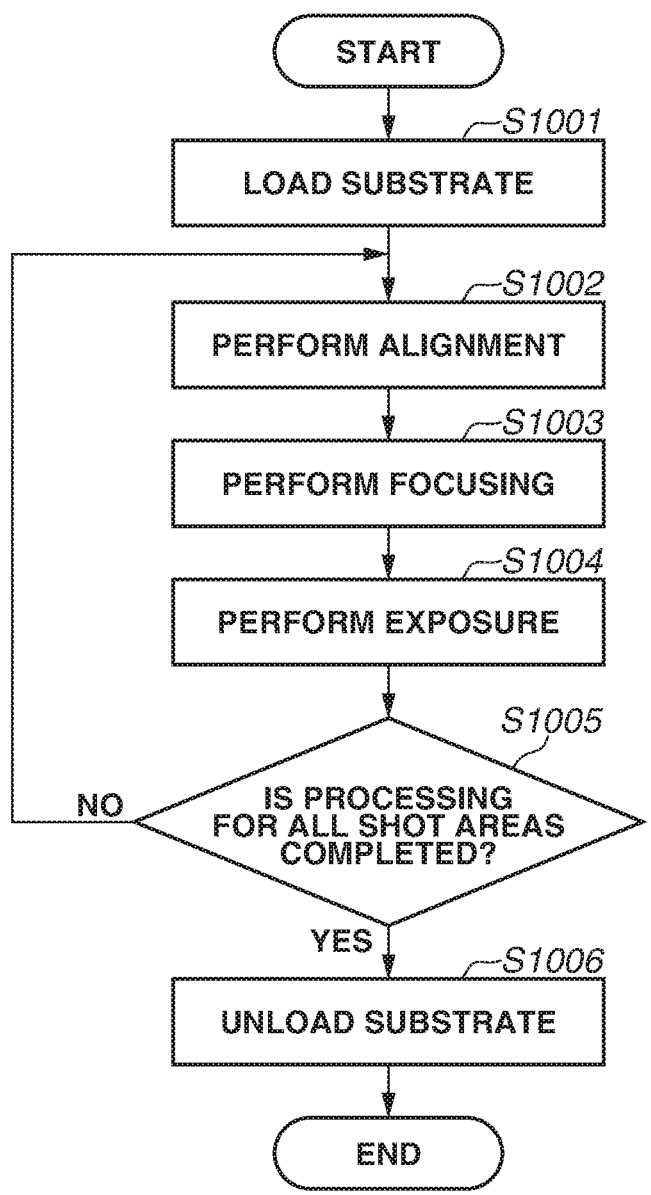

INFORMATION PROCESSING APPARATUS, STORAGE MEDIUM, LITHOGRAPHY APPARATUS, LITHOGRAPHY SYSTEM, AND ARTICLE MANUFACTURING METHOD

BACKGROUND

Field of the Disclosure

The present disclosure relates to an information processing apparatus, a storage medium, a lithography apparatus, a lithography system, and an article manufacturing method.

Description of the Related Art

With a growing demand for miniaturization of semiconductor devices, microelectromechanical systems (MEMS), and the like, a microfabrication technique for molding an imprint material on a substrate using a mold (original) to form a pattern of the imprint material on the substrate has been attracting attention, in addition to a conventional photolithography technique. This technique is also called an imprint technique. With this technique, a fine structure on the order of nanometers can be formed on a substrate. As one imprint technique, for example, a light curing method is known. In an imprint apparatus that employs the light curing method, a light-curing imprint material is first coated on each shot area, which is an imprint area, on a substrate. Next, the imprint material and a pattern portion of a mold are brought into contact (mold pressing) while the pattern portion of the mold is aligned with the shot areas, and the pattern portion is filled with the imprint material. Then, the imprint material is cured by irradiation with light, and the pattern portion of the mold is separated from the imprint material, to thereby form a pattern of the imprint material on the shot areas on the substrate.

In terms of the quality, it is important to perform an inspection to determine whether the pattern that satisfies a desired accuracy has been formed on the shot areas of the substrate. However, since it takes a lot of time to perform the inspection for all shot areas on the substrate, the inspection is performed only on some of the shot areas.

Japanese Patent No. 3637041 discusses a method in which in an etching process for semiconductor manufacturing, inspection conditions are determined based on specific values measured during the etching process and an inspection is performed on a substrate on which the etching process has been performed under the determined inspection conditions. For example, the amount of plasma emission is measured during the substrate etching process to predict the finished etching shape. Then, shape measurement is performed on the substrate with etching shape being predicted to be out of specification. Further, for example, a dielectric dissipation factor of a high-frequency power supply is measured during the substrate etching process to predict the etching uniformity. Then, distribution measurement is performed on the substrate where it is predicted that the etching uniformity is out of specification.

Japanese Patent No. 3637041 is based on the premise that the correspondence relation between the values measured during the substrate etching process and inspection conditions to be applied when an inspection is performed on the substrate is clear. However, if the correspondence relation between desired measured values and inspection conditions is not clear, the inspection conditions cannot be determined by the method described in Japanese Patent No. 3637041.

SUMMARY

The present disclosure is directed to providing an information processing apparatus, a program, a lithography apparatus, a lithography system, and an article manufacturing method which are capable of acquiring inspection conditions for performing an inspection on a pattern formed on a substrate.

An information processing apparatus according to an aspect of the present invention is an information processing apparatus for acquiring an inspection condition for performing an inspection on a pattern formed by a lithography apparatus that forms a pattern on a substrate with an original, the information processing apparatus including an acquisition unit configured to acquire a second inspection condition to be applied in a case where an inspection is performed on a second pattern by inputting third information indicating a state of the lithography apparatus acquired when the second pattern is formed to a model, wherein the model is acquired by machine learning with learning data including first information indicating a state of the lithography apparatus acquired when a first pattern is formed and second information indicating a first inspection condition applied when an inspection is performed on the first pattern.

Further features of the present invention will become apparent from the following description of exemplary embodiments with reference to the attached drawings.

BRIEF DESCRIPTION OF THE DRAWINGS

FIG. 10 is a flowchart illustrating an exposure processing.

DESCRIPTION OF THE EMBODIMENTS

Figure 1A:
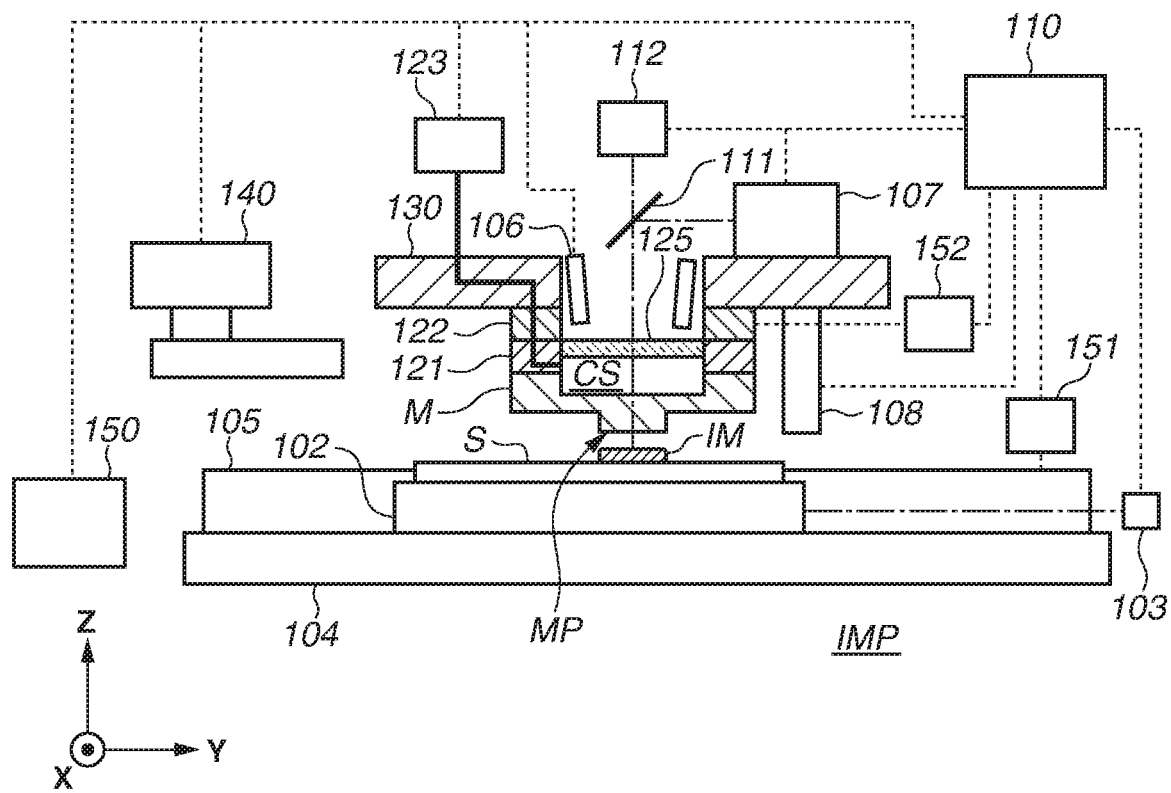
FIGS. 1A and 1B each illustrate an imprint apparatus.

Preferred exemplary embodiments of the present invention will be described in detail below with reference to the accompanying drawings. In the drawings, the same members are denoted by the same reference numerals, and redundant descriptions are omitted.

Figure 1B:
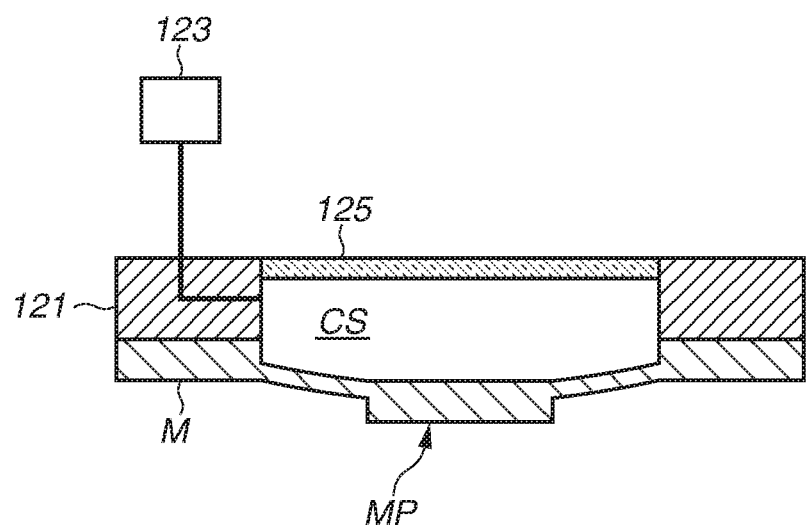

A first exemplary embodiment will be described below. The present exemplary embodiment illustrates an example in which an imprint apparatus is used as a lithography apparatus. FIGS. 1A and 1B each illustrate the imprint apparatus. First, a typical configuration of the imprint apparatus will be described with reference to FIG. 1A. An imprint apparatus IMP is an apparatus that brings an imprint material IM supplied onto a substrate S into contact with a mold M, and provides the imprint material IM with energy for curing, thereby forming a pattern of a cured product to which a concave-convex pattern of the mold M is transferred.

In this case, as the imprint material IM, a curing composition (also called an uncured resin) that is cured by receiving energy for curing. As the energy for curing, electromagnetic waves, heat, and the like are used. Examples of electromagnetic waves include light such as infrared rays, visible rays, and ultraviolet rays with a wavelength selected from the range of 150 nm to 1 mm.

The curing composition is a composition to be cured by irradiation with light or heating. Among such curing compositions, a light-curing composition that is cured by light contains at least a polymerizable compound and a photopolymerization initiator, and may also contain a non-polymerizable compound or a solvent, if necessary. The non-polymerizable compound is at least one compound selected from the group including sensitizers, hydrogen donors, internal mold releasing agents, surfactants, antioxidants, and polymer components.

The imprint material IM is applied onto the substrate S in the form of a film by a spin coater or a slit coater. Alternatively, the imprint material IM may be applied onto the substrate S by a liquid injection head in the form of droplets or an island or film formed by a plurality of droplets being combined. The viscosity (viscosity at 25° C.) of the imprint material IM is, for example, in the range from 1 mPa·s to 100 mPa·s.

Glass, ceramics, metal, resin, or the like is used for the substrate S. A member made of a material different from the substrate S may be formed on the surface of the substrate S, if necessary. Specifically, the substrate S is a silicon wafer, a compound semiconductor wafer, a glass wafer containing quartz as a material.

The mold M has a rectangular outer peripheral shape and includes a pattern portion MP including a pattern (a concave-convex pattern, such as a circuit pattern, to be transferred to the substrate S) that is three-dimensionally formed on a surface (pattern surface) opposed to the substrate S. The mold M is formed of a material, such as quartz, which can transmit light. The mold M also includes a concave portion that is formed on an opposite side of the pattern portion MP.

The present exemplary embodiment is described assuming that the imprint apparatus IMP employs a light curing method for curing the imprint material IM by irradiation with light. A direction parallel to an optical axis of light with which the imprint material IM is irradiated on the substrate S, is referred to as a Z-axis direction. Two directions perpendicular to each other within a plane vertical to the Z-axis direction are referred to as an X-axis direction and a Y-axis direction, respectively. A rotation about the X-axis, a rotation about the Y-axis, and a rotation about the Z-axis are represented by θX, θY, and θZ, respectively. Control or driving with regard to the X-axis, the Y-axis, and the Z-axis means control or driving with regard to the direction parallel to the X-axis, the direction parallel to the Y-axis, and the direction parallel to the Z-axis. Control or driving with regard to a θX-axis, a θY-axis, and a θZ-axis means control or driving with regard to a rotation about an axis parallel to the X-axis, a rotation about an axis parallel to the Y-axis, and a rotation about an axis parallel to the Z-axis. A position is information that can be specified based on X-axis, Y-axis, and Z-axis coordinates. An orientation is information that can be specified by values based on the θX-axis, the θY-axis, and the θZ-axis.

The imprint apparatus IMP can include a substrate holding portion 102 that holds the substrate S, a substrate driving mechanism 105 (moving portion) that drives the substrate holding portion 102, a base 104 that supports the substrate holding portion 102, and a position measurement portion 103 that measures the position of the substrate holding portion 102. Examples of the substrate driving mechanism 105 can include a motor such as a linear motor. The imprint apparatus IMP can include a sensor 151 that detects a driving force required for the substrate driving mechanism 105 to move the substrate S (substrate holding portion 102) during alignment. The driving force required during the alignment corresponds to, for example, a shear force acting between the substrate S and the mold M. The alignment is performed in a state where the imprint material IM on the substrate S is in contact with the pattern portion MP of the mold M. The shear force is a force acting mainly in a direction along an XY plane including the X-axis and the Y-axis. The driving force required during the alignment has a correlation with, for example, the magnitude of a current to be supplied to the motor of the substrate driving mechanism 105 during the alignment. The sensor 151 can detect the driving force based on the magnitude of the current. The sensor 151 is a type of a sensor that measures the shear force received by the mold M during formation of a pattern. Drive control values can include a command value that is output to the substrate driving mechanism 105 by a control unit 110 to be described below. The substrate holding portion 102 includes a suction unit (not illustrated) for holding the substrate S. As a method by which the suction unit sucks the substrate S, a vacuum suction method, an electrostatic suction method, or other suction methods can be used. The suction unit can include a plurality of suction pads (suction portions) which are arranged on a holding surface of the substrate holding portion 102 on which the substrate S is held. A suction force is controlled for each of suction pads depending on the position of a shot area on which an imprint process is performed. As a result, information about a distribution of the suction force in the suction unit of the substrate holding portion 102 can be acquired.

The imprint apparatus IMP can include a mold holding portion 121 that holds the mold M, a mold driving mechanism 122 (moving portion) that drives the mold holding portion 121 to move the mold M, and a support structure 130 that supports the mold driving mechanism 122. Examples of the mold driving mechanism 122 can include a motor such as a voice coil motor. The imprint apparatus IMP can include one or more sensors 152 that detect at least one of a releasing force and a pressing force. The releasing force is a force acting on the mold M to separate the mold M from the cured product of the imprint material IM on the substrate S. The pressing force is a force acting on the mold M to bring the mold M into contact with the imprint material IM on the substrate S. The releasing force and the pressing force are forces that act mainly in the direction along the Z-axis direction. The releasing force and the pressing force have a correlation with, for example, the magnitude of a current to be supplied to the motor of the mold driving mechanism 122. The sensor 152 can detect a separating force and a pressing force based on the magnitude of the current. The sensor 152 is a type of a sensor that measures at least one of a releasing force and a pressing force received by the mold M during formation of a pattern. If a plurality of sensors 152 is provided, the releasing force and the pressing force acting on a plurality of positions of the mold M can be detected and information about a distribution of the releasing force and the pressing force can be acquired. Drive control values can include a command value that is output to the mold driving mechanism 122 from the control unit 110 to be described below. Further, the mold holding portion 121 may include a mold deforming unit (not illustrated) that deforms the mold M so that the shape of the pattern portion MP of the mold M matches the shape of each shot area of the substrate S. As the mold deforming unit, for example, a unit that deforms the shape of the pattern portion MP in the direction along the XY plane by adding a force from a side of the mold M can be used.

The substrate driving mechanism 105 and the mold driving mechanism 122 constitute a driving mechanism that adjusts relative positions and relative orientations of the substrate S and the mold M. The adjustment of the relative positions of the substrate S and the mold M by the driving mechanism includes driving for bringing the mold M into contact with the imprint material IM on the substrate S and for separating the mold M from the cured imprint material IM (pattern of the cured product). The substrate driving mechanism 105 can be configured to drive the substrate S with respect to a plurality of axes (e.g., three axes of the X-axis, the Y-axis, and the θZ-axis, preferably, six axes of the X-axis, the Y-axis, the Z-axis, the θX-axis, the θY-axis, and the θZ-axis). The mold driving mechanism 122 can be configured to drive the mold M with respect to a plurality of axes (e.g., three axes of the Z-axis, the θX-axis, and the θY-axis, preferably, six axes of the X-axis, the Y-axis, the Z-axis, the θX-axis, the θY-axis, and the θZ-axis). Accordingly, drive control values can include a command value for driving the substrate driving mechanism 105 and the mold driving mechanism 122 with respect to six axes of the X-axis, the Y-axis, the Z-axis, the θX-axis, the θY-axis, and the θZ-axis.

The imprint apparatus IMP can include a mold conveying mechanism 140 which conveys the mold M, and a mold cleaner 150. The mold conveying mechanism 140 can be configured to, for example, convey the mold M to the mold holding portion 121, or convey the mold M from the mold holding portion 121 to an original stocker (not illustrated), the mold cleaner 150, or the like. The mold cleaner 150 cleans the mold M with ultraviolet rays, chemicals, or the like.

The mold holding portion 121 can include a window member 125 for forming a cavity CS which is a space including the concave portion formed on the opposite side of the pattern portion MP of the mold M. The imprint apparatus IMP can include a deforming mechanism 123 for deforming the pattern portion MP of the mold M into a convex shape in a −Z-axis direction toward the substrate S as schematically illustrated in FIG. 1B by controlling the pressure in the cavity CS (hereinafter referred to as a cavity pressure).

The imprint apparatus IMP can also include an alignment measurement portion 106, an irradiation portion 107, an image capturing portion 112, and an optical member 111. The alignment measurement portion 106 illuminates an alignment mark on the substrate S and an alignment mark on the mold M, and captures an image thereof to measure a relative position between the alignment marks. The alignment measurement portion 106 can be positioned by a driving mechanism (not illustrated) depending on the position of each alignment mark to be observed. Information about the position of each alignment mark to be measured by the alignment measurement portion 106 is referred to as an alignment measured value. The alignment measured value can include the position of each alignment mark and the relative position between alignment marks. The image captured by the alignment measurement portion 106 is referred to as an alignment image.

The irradiation portion 107 irradiates the imprint material IM with curing light (e.g., light such as ultraviolet rays) for curing the imprint material IM through the optical member 111, to thereby cure the imprint material IM. The irradiation portion 107 may include a substrate deforming unit (not illustrated) for deforming each shot area so that the shape of the pattern portion MP of the mold M matches the shape of each shot area of the substrate S. As the substrate deforming unit, for example, a unit is used that deforms the shape of each shot area in the direction along the XY plane when the irradiation portion 107 irradiates the shot area with light (e.g., light such as infrared rays) which does not cure the imprint material IM, so that the shot area expands by heating.

The image capturing portion 112 captures an image of the imprint material IM having contacted the pattern portion MP of the mold M through the optical member 111 and the window member 125. The image captured by the image capturing portion 112 is hereinafter referred to as a spread image.

The imprint apparatus IMP can include a dispenser 108 that supplies the imprint material IM onto the substrate S. The dispenser 108 includes a discharge port for discharging the imprint material IM onto the substrate S, for example, by an inkjet method. The dispenser 108 supplies the imprint material IM to the substrate S in accordance with a drop recipe in which the amount of the imprint material IM to be supplied, the position where the imprint material IM is supplied, and the like are determined. The drop recipe is prescribed in advance. For example, information about the drop recipe is stored in a storage device 204 of the control unit 110 to be described below. While the dispenser 108 supplies the imprint material IM, the substrate S held on the substrate holding portion 102 moves to supply the imprint material IM to a predetermined position on the substrate S.

The imprint apparatus IMP can include the control unit 110 that controls the operation, adjustment, and the like of the units, such as the substrate driving mechanism 105 and the mold driving mechanism 122, in the imprint apparatus IMP.

The control unit 110 controls the operation, adjustment, and the like of each unit in the imprint apparatus IMP, thereby controlling the imprint process for forming a pattern on the substrate S. The control unit 110 is an information processing apparatus that can be configured using, for example, a programmable logic device (PLD) such as a field programmable gate array (FPGA), an application specific integrated circuit (ASIC), or a computer incorporating programs, or a combination of all or some of these elements. Alternatively, the control unit 110 may be integrated with the other parts of the imprint apparatus IMP (in a common housing), or may be configured separately from the other parts of the imprint apparatus IMP (in another housing).

Figure 2:
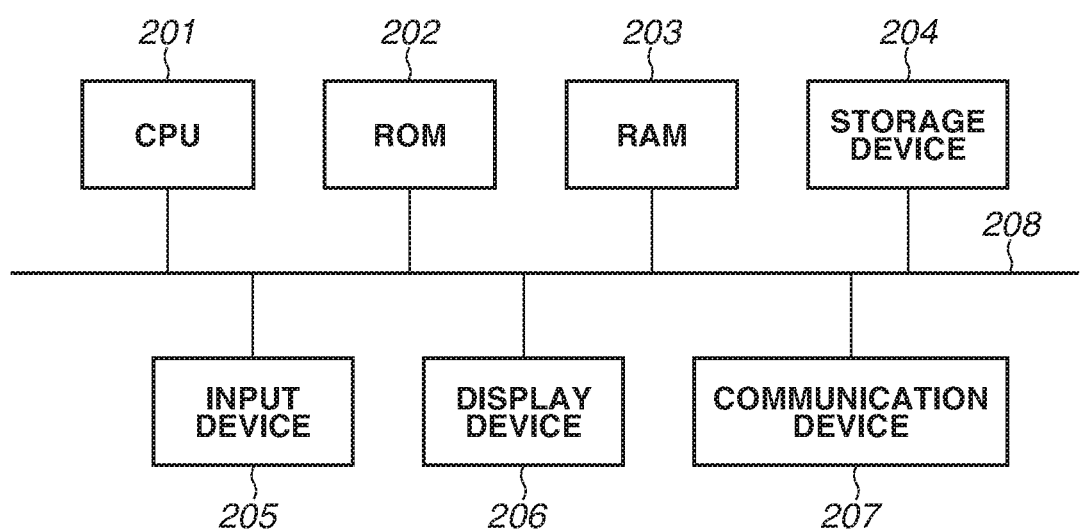
FIG. 2 is a block diagram illustrating an information processing apparatus.

FIG. 2 illustrates the information processing apparatus. Each component of the information processing apparatus functions based on a program. In an example illustrated in FIG. 2, a central processing unit (CPU) 201 is a processing unit that performs an arithmetic operation for control processing based on programs and controls each component connected to a bus 208. A read-only memory (ROM) 202 is a memory for reading data and stores programs and data. A random access memory (RAM) 203 is a memory for reading and writing data and is used to store programs and data. The RAM 203 is used to temporarily store data such as results of the arithmetic operation performed by the CPU 201. The storage device 204 is also used for storing programs and data. The storage device 204 is also used as a temporary storage area for storing programs and data for an operating system (OS) of the information processing apparatus.

Although the storage device 204 is slower than the RAM 203 in a data input/output speed, the storage device 204 can store large volumes of data. The storage device 204 is desirably a nonvolatile storage device that can permanently store data so that the stored data can be referred to for a long period of time. Although the storage device 204 is constituted mainly by a magnetic storage device (hard disk drive (HDD)), the storage device 204 may be a device that reads or writes data with an external medium, such as a compact disc (CD), a digital versatile disc (DVD), or a memory card which are loaded therein. An input device 205 is a device for inputting characters or data to the information processing apparatus and can be each type of keyboard, mouse, or the like. A display device 206 is a device for displaying information required for operation of the information processing apparatus, processing results, or the like and can be a cathode-ray tube (CRT), a liquid crystal monitor, or the like. A communication device 207 connects to a network 304, which is described below, to perform data communication using a communication protocol, such as a transmission control protocol/internet protocol (TCP/IP), and is used in communicating with another information processing apparatus.

Figure 3:
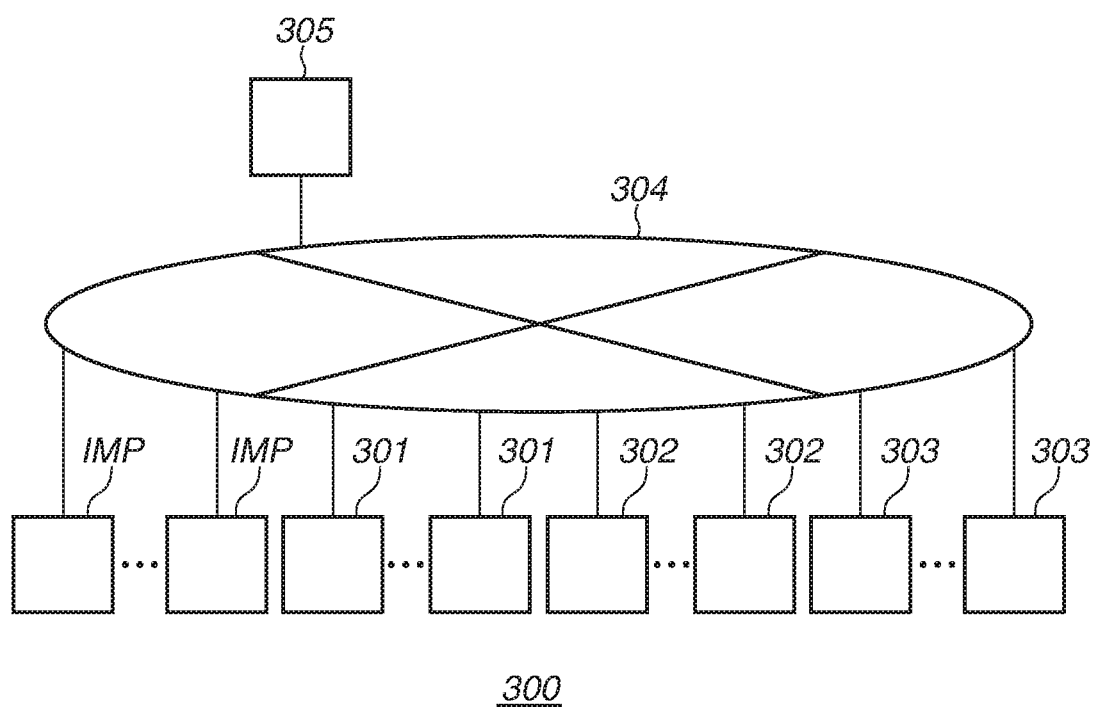
FIG. 3 illustrates an article manufacturing system.

FIG. 3 illustrates an article manufacturing system. FIG. 3 illustrates a configuration of an article manufacturing system 300 for manufacturing an article such as a semiconductor device. Examples of the article manufacturing system 300 can include one or more imprint apparatuses IMP, one or more inspection apparatuses 301, and one or more processing apparatuses 302. Examples of the inspection apparatus 301 can include an overlay inspection apparatus, a CD inspection apparatus, a pattern inspection apparatus, and an electrical characteristics inspection apparatus. The overlay inspection apparatus described herein refers to an apparatus that inspects the accuracy of a positional deviation between a pattern of an upper layer and a pattern of a lower layer of a substrate on which a pattern is formed in multiple layers. The CD inspection apparatus is an apparatus that inspects the accuracy of dimensions such as a line width of a pattern formed on a substrate. The pattern inspection apparatus is an apparatus that performs an inspection as to the presence or absence of a pattern that does not satisfy a desired accuracy, for example, due to foreign substances adhering to a substrate on which the pattern is formed, or due to the imprint material IM which is not filled. The electrical characteristics inspection apparatus is an apparatus that inspects the accuracy of electrical characteristics of a semiconductor device or the like manufactured from a substrate on which a pattern is formed. Examples of the processing apparatus 302 can include a coating apparatus, a developing apparatus, an etching apparatus, and a film formation apparatus. The article manufacturing system 300 can also include one or more acquisition apparatuses 303. The acquisition apparatus 303 acquires inspection conditions as conditions for an inspection to be performed by the inspection apparatus 301. These apparatuses are connected to a control apparatus 305, which is an external apparatus different from the imprint apparatus IMP, via the network 304, and can be controlled by the control apparatus 305. Like the control unit 110 of the imprint apparatus IMP, each of the acquisition apparatus 303 and the control apparatus 305 is an information processing apparatus that can be configured using, for example, a PLD such as an FPGA, an ASIC, or a general-purpose computer incorporating programs, or a combination of all or some of these elements. The inspection apparatus 301 and the processing apparatus 302 can include a control unit having a configuration similar to that of the control unit 110 of the imprint apparatus IMP.

As the acquisition apparatus 303, the control unit 110 of the imprint apparatus IMP or the control apparatus 305 may be used, or the control unit 110 and the control apparatus 305 may be used in combination. While the present exemplary embodiment illustrates an example in which the imprint apparatus IMP is used as an example of the lithography apparatus, an exposure apparatus that exposes a substrate to light to form a pattern on the substrate may be used as an example of the lithography apparatus. As another example of the lithography apparatus, an apparatus such as a drawing apparatus for forming a pattern on a substrate with charged particle beams (electron beams, ion beams, or the like) via a charged particle optical system may be used. In the article manufacturing system 300, at least two apparatuses selected from the group including the imprint apparatus IMP, the exposure apparatus, and the drawing apparatus may be adopted. Further, in the present exemplary embodiment, a system including the lithography apparatus, such as the imprint apparatus IMP, and the acquisition apparatus 303 is referred to as a lithography system.

A method for acquiring inspection conditions according to the present exemplary embodiment will be described below. In the present exemplary embodiment, the imprint process for forming a pattern on a substrate is performed and apparatus information indicating a state of the imprint apparatus IMP is acquired to obtain inspection conditions for an inspection to be performed by the inspection apparatus 301. The inspection conditions described herein can include information about a substrate on which an inspection is performed among a plurality of substrates, a shot area on which an inspection is performed among a plurality of shot areas on the substrate, items for which an inspection is performed, levels at which an inspection is performed, and the like. For example, the inspection conditions can include a condition that the inspection is performed on the third and tenth substrates among 25 substrates belonging to one lot. The inspection conditions can also include a condition that the inspection is performed on the 30th and 50th shot areas among 100 shot areas on the substrate on which the inspection is performed. The inspection conditions can also include a condition that an overlay inspection and a foreign substance inspection are performed among a plurality of inspection items, such as an overlay inspection, a pattern dimensions inspection, a foreign substance inspection, and an electrical characteristics inspection. The inspection conditions can also include a condition that, assuming that a plurality of alignment marks are arranged on the shot areas on which the overlay inspection is performed, measurement is performed on all the alignment marks to perform the inspection at a detail level. The inspection conditions can also include a condition that the inspection is performed on one alignment mark to perform the inspection at a simple level.

The apparatus information (first information and third information) indicates the state of the imprint apparatus IMP related to formation of a pattern, and can include control information which is used to control each unit of the imprint apparatus IMP in forming the pattern and information obtained through measurements performed by various sensors or the like.

In the present exemplary embodiment, the inspection conditions are obtained from the apparatus information acquired during the imprint process. Further, appropriate inspection conditions can be obtained using a plurality of pieces of apparatus information.

First, the apparatus information acquired by performing the imprint process and the information related to the pattern inspection result obtained by the inspection apparatus 301 inspecting the substrate on which the imprint process has been performed. In this case, examples of the information related to the inspection result can include a positional deviation amount of a pattern with respect to a shot area on a base on which the pattern is already formed. Then, a model is acquired by machine learning using, as learning data, information (second information) in which the apparatus information is associated with the inspection conditions obtained based on the information related to the inspection result. The information indicating the inspection conditions can be acquired from the apparatus information by using the acquired model. Thus, the inspection conditions can be acquired without causing the inspection apparatus 301 to inspect the substrate S, and the inspection apparatus 301 can perform an inspection accurately.

Figure 4:
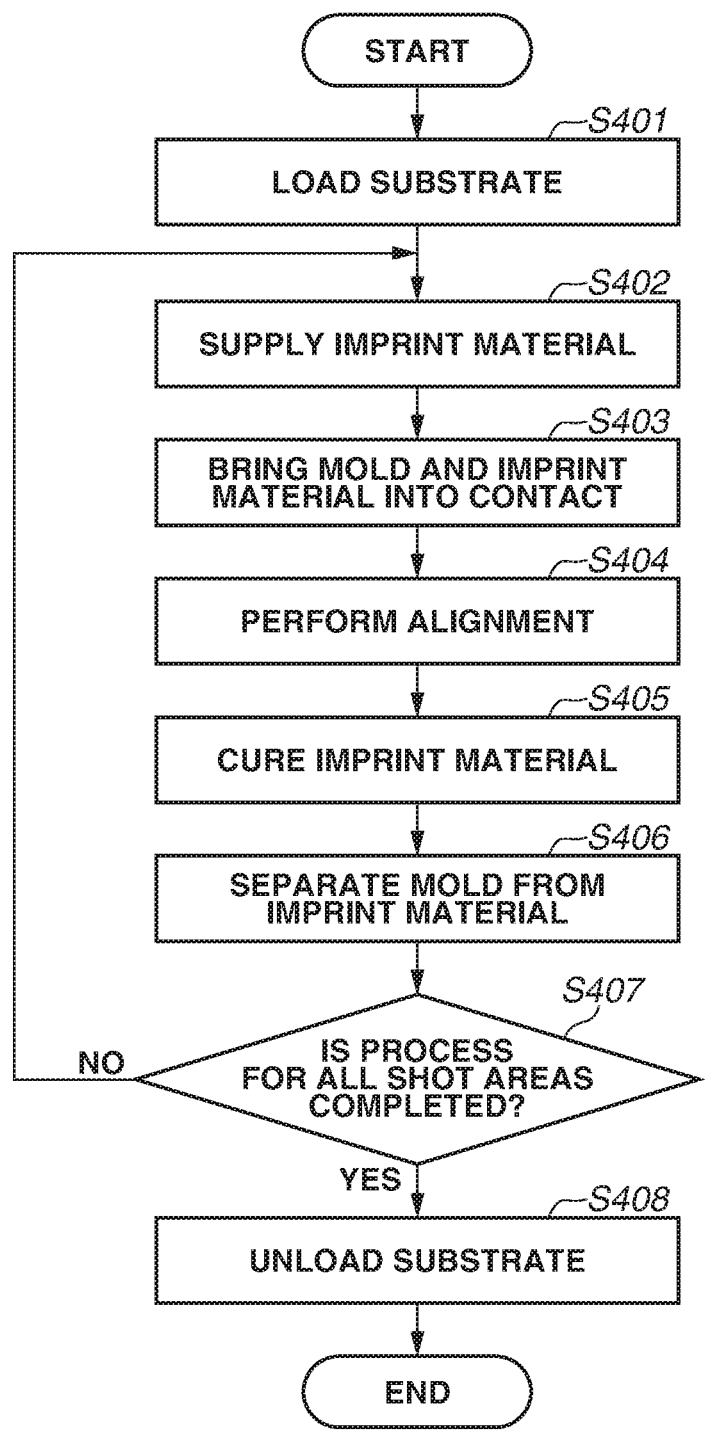
FIG. 4 is a flowchart illustrating an imprint process.

FIG. 4 is a flowchart illustrating the imprint process. First, in step S401, the control unit 110 controls a substrate conveying mechanism (not illustrated) to load the substrate S into the substrate holding portion 102. Next, in steps S402 to S406, the imprint process (pattern formation) is executed on a target shot area among the plurality of shot areas on the substrate S. In steps S402 to S406, the control unit 110 stores, in the storage device 204, the apparatus information used as learning data for machine learning. While the following description is made assuming that the apparatus information is stored in the storage device 204, the apparatus information can be stored in at least one of the storage device 204 and the RAM 203.

Examples of the apparatus information can include the position of the shot area on the substrate S on which the imprint process is executed, a command value used for the control unit 110 to control the substrate driving mechanism 105 or the like, and information obtained through measurements performed by the image capturing portion 112, the sensor 151, and the like.

In step S402, the control unit 110 controls the dispenser 108 to supply the imprint material IM to each shot area on the substrate S based on a preliminarily set drop recipe. Further, the control unit 110 controls the substrate driving mechanism 105 to drive the substrate holding portion 102 in the direction along the XY plane so as to supply the imprint material IM to a predetermined position on the shot area of the substrate S. Further, the control unit 110 stores, in the storage device 204, information about the position of the shot area on which the imprint process is executed and information about the drop recipe as the apparatus information.

Figure 5:
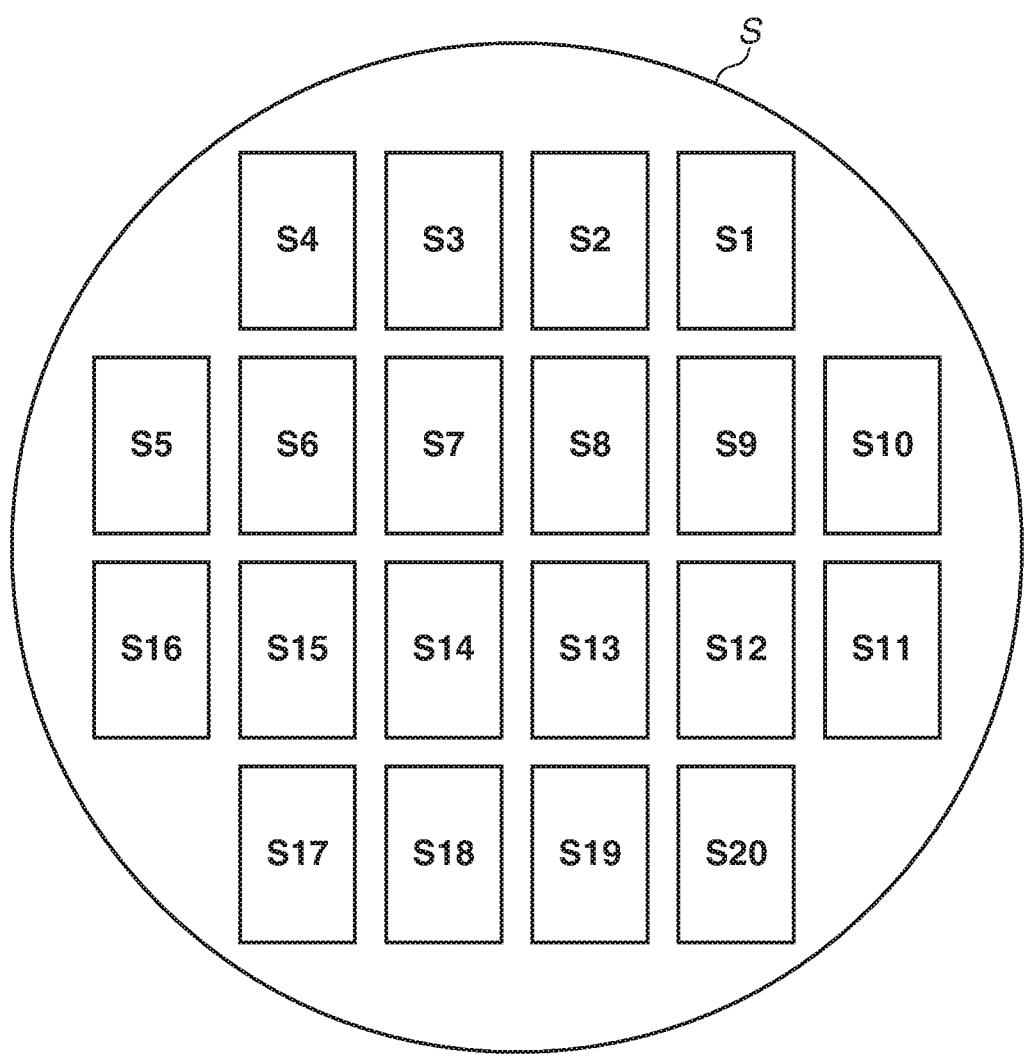
FIG. 5 illustrates an example of each shot area on a substrate.

The position of each shot area will now be described with reference to FIG. 5. FIG. 5 illustrates an example of each shot area on the substrate S. Rectangular shot areas S1 to S20 are arranged on the substrate S. The position of each shot area is represented by coordinate values indicating the position of each shot on the substrate S. Examples of the position of each shot area can include the center of each shot area, the position of an alignment mark corresponding to each shot area, four-corner points of each shot area, and coordinate values of one or more points such as a point on the outer periphery of each shot area. As the position of each shot area, layout information about each shot area that is preliminarily stored in the storage device 204 may be used.

Referring again to FIG. 4, in step S403, the control unit 110 controls the mold driving mechanism 122 in such a manner that the mold driving mechanism 122 moves in the Z-axis direction to bring the mold M and the imprint material IM on the substrate S into contact. Further, the control unit 110 may control the substrate driving mechanism 105 to move in the Z-axis direction, or may control the mold driving mechanism 122 and the substrate driving mechanism 105 to move in the Z-axis direction. The control unit 110 stores stage control information as the apparatus information in the storage device 204. Examples of the stage control information can include a command value used by the control unit 110 to control the substrate driving mechanism 105 and the mold driving mechanism 122. The control unit 110 stores, in the storage device 204, information about a pressing force obtained when the pattern portion MP of the mold M is brought into contact with the imprint material IM as the apparatus information. Examples of the information about the pressing force can include an output value from the sensor 152 when the pattern portion MP of the mold M is brought into contact with the imprint material IM. If a plurality of sensors 152 is provided, information about a distribution of the pressing force obtained based on output values from the plurality of sensors 152 may be used as the information about the pressing force.

In step S403, the control unit 110 controls the deforming mechanism 123 to adjust the cavity pressure for deforming the pattern portion MP of the mold M into a convex shape in the −Z-axis direction toward the substrate S. The control unit 110 stores, in the storage device 204, the information about the cavity pressure obtained in step S403 as the apparatus information. In this case, the information about the cavity pressure can include a pressure value calculated based on a command value for the deforming mechanism 123, and a pressure value measured by a pressure gauge (not illustrated).

Further, in step S403, the control unit 110 controls the image capturing portion 112 to capture an image (spread image) of the imprint material IM having contacted the mold M. Then, the control unit 110 stores, in the storage device 204, information about the spread image captured by the image capturing portion 112 as the apparatus information. Examples of the information about the spread image can include pixel values of all pixels included in the spread image, and a feature amount extracted from the image.

Further, in step S403, the control unit 110 performs control to generate the suction force for each of suction pads included in the substrate holding portion 102 depending on the position of the shot area on which the imprint process is performed. Then, the control unit 110 stores, in the storage device 204, information about a distribution of the controlled suction force for each of suction pads as the apparatus information.

In step S404, the control unit 110 controls the alignment measurement portion 106 to measure a relative position between an alignment mark on the substrate S and an alignment mark on the mold M. Then, the control unit 110 performs alignment between the pattern portion MP of the mold M and the shot area on the substrate S to which the imprint material IM is supplied. Specifically, the control unit 110 controls the substrate driving mechanism 105 to move in the direction along the XY plane to perform the alignment based on the measured value obtained through the measurement performed by the alignment measurement portion 106. The control unit 110 controls the substrate driving mechanism 105 to move to perform the alignment until a relative position between the alignment marks falls within an allowable range of a target relative position. Further, the control unit 110 may control the mold driving mechanism 122 to move in the direction along the XY plane to perform the alignment, or may control the mold driving mechanism 122 and the substrate driving mechanism 105 to move in the direction along the XY plane to perform the alignment. In addition, the control unit 110 may use the mold deforming unit and the substrate deforming unit, which are described above, to deform at least one of the pattern portion MP of the mold M and the shot area of the substrate S so that the shape of the pattern portion MP of the mold M matches the shape of the shot area. In this case, the control unit 110 stores an alignment measured value of an alignment image captured by the alignment measurement portion 106 and the like, as the apparatus information, in the storage device 204. The control unit also stores the command values output to the mold driving mechanism 122, the substrate driving mechanism 105, the mold deforming unit, and the substrate deforming unit, as the apparatus information, in the storage device 204.

In step S405, the control unit 110 controls the irradiation portion 107 to irradiate the imprint IM on the substrate S with light so as to cure the imprint material IM on the substrate S. As a result, the imprint material IM is cured and the pattern of the imprint material IM is formed. The control unit 110 also stores an accumulated amount of light emitted by the irradiation portion 107, as the apparatus information, in the storage device 204.

In step S406, the control unit 110 controls the mold driving mechanism 122 to move in the Z-axis direction so as to separate (release) the imprint material IM from the pattern portion MP of the mold M. Further, the control unit 110 may control the substrate driving mechanism 105 to move in the Z-axis direction. Alternatively, the control unit 110 may control the mold driving mechanism 122 and the substrate driving mechanism 105 to move in the Z-axis direction. The control unit 110 stores, in the storage device 204, information about a releasing force obtained when the imprint material IM is separated from the pattern portion MP of the mold M as the apparatus information. Examples of the information about the releasing force can include an output value from the sensor 152 when the pattern portion MP of the mold M is brought into contact with the imprint material IM. If a plurality of sensors 152 is provided, the information about the releasing force may include information about a distribution of the releasing force obtained based on output values from the plurality of sensors 152.

Further, in step S406, the control unit 110 controls the deforming mechanism 123 to adjust the cavity pressure so as to deform the pattern portion MP of the mold M into a convex shape in the −Z-axis direction toward the substrate S. The control unit 110 stores, in the storage device 204, information about the cavity pressure obtained in step S406 as the apparatus information. In this case, the information about the cavity pressure can include a pressure value calculated based on a command value for the deforming mechanism 123, and a pressure value measured by the pressure gauge (not illustrated).

Further, in step S406, the control unit 110 controls the image capturing portion 112 to capture an image (spread image) of the imprint material IM having contacted the mold M. Then, the control unit 110 stores, in the storage device 204, information about the spread image captured by the image capturing portion 112 as the apparatus information. Examples of the information about the spread image can include pixel values of all pixels included in the spread image, and a feature amount extracted from the image.

Further, the apparatus information such as the stage control information may be information obtained at a certain point of time, or time-series information in a certain period.

In step S407, the control unit 110 determines whether the imprint process for all shot areas on the substrate S is completed. If the control unit 110 determines that the imprint process for all shot areas on the substrate S is not completed (NO in step S407), the processing returns to step S402 and the control unit 110 performs control to carry out the imprint process on the subsequent shot area. If the control unit 110 determines that the imprint process for all shot areas on the substrate S is completed (YES in step S407), the processing proceeds to step S408.

In step S408, the control unit 110 controls the substrate conveying mechanism (not illustrated) to unload the substrate S from the substrate holding portion 102.

After that, the substrate S on which the imprint process has been performed and the pattern has been formed is conveyed to the inspection apparatus 301 to perform an inspection on the substrate S. For example, when the overlay inspection apparatus is the inspection apparatus 301, an overlay inspection is performed on the pattern formed on the substrate S. The inspection apparatus 301 stores the inspection result for each shot area in the storage device of the inspection apparatus 301. The inspection result of the overlay inspection can include a measurement result obtained by measuring a positional deviation of the pattern on at least one point that is located on the shot area of the substrate S.

While FIG. 4 illustrates an example in which the imprint process is performed on a single substrate S, the imprint process may be performed on a lot that includes a plurality of substrates S. In this case, the control unit 110 determines whether the imprint process for all the substrates S within the lot is completed after step S408. If the control unit 110 determines that the imprint process for all the substrates S in the lot is not completed, the processing returns to step S401, and the control unit 110 controls the substrate conveying mechanism (not illustrated) to convey the subsequent substrate S onto the substrate holding portion 102. If the control unit 110 determines that the imprint process for all the substrates S in the lot is completed, the processing is terminated.

In this case, the inspection result about the pattern formed by performing the imprint process on the substrates S has a correlation with a plurality of pieces of apparatus information acquired by the imprint apparatus IMP. For example, the inspection result of the overlay inspection is affected by the alignment between the shot area on the substrates S and the pattern portion MP of the mold M. Accordingly, the inspection result of the overlay inspection has a correlation with the alignment image captured by the alignment measurement portion 106, because the alignment image acquired as the apparatus information includes information about the alignment mark used for performing alignment. Further, the inspection result of the overlay inspection also has a correlation with the position of alignment mark included in the alignment measured value and the relative position between the alignment marks.

Further, the inspection result of the overlay inspection is affected by the adjustment of the relative position between the substrate S and the mold M in a state where the imprint material IM on the substrate S and the pattern portion MP of the mold M are in contact with each other, and by the correction of the shape of the pattern portion MP of the mold M and the shape of the shot area of the substrates S. Therefore, the inspection result of the overlay inspection has a correlation with the command values output to the mold driving mechanism 122, the substrate driving mechanism 105, the mold deforming unit, and the substrate deforming unit.

Further, the inspection result of the pattern inspection about the pattern formed on the substrate S by performing the imprint process also has a correlation with the apparatus information acquired by the imprint apparatus IMP. For example, the pattern formed on the substrate S is affected by the releasing force or pressing force in a state where the imprint material IM on the substrates and the pattern portion MP of mold M are in contact with each other. Therefore, the inspection result of the pattern inspection has a correlation with the information about the releasing force or the pressing force detected by the sensor 152. Further, the pattern formed on the substrate S is affected by the shape of the pattern portion MP of the mold M. Therefore, the inspection result of the pattern inspection also has a correlation with the cavity pressure. Further, the pattern formed on the substrate S is affected by the shape of the substrate S at the releasing time. Therefore, the inspection result of the pattern inspection has a correlation with the suction force at the suction portion of the substrate holding portion 102. Further, the spread image captured by the image capturing portion 112 at the pressing time and the releasing time includes a state where the imprint material IM is not filled or existence of foreign substances. Therefore, the inspection result of the pattern inspection also has a correlation with the spread image. Further, the pattern formed on the substrate S is affected by the accumulated amount of light that is radiated by the irradiation portion 107 at a time of curing. Therefore, the inspection result of the pattern inspection has a correlation with the accumulated amount of light radiated by the irradiation portion 107. Further, the pattern formed on the substrate S is affected by the supply amount and the position of the imprint material IM supplied by the dispenser 108. Therefore, the inspection result of the pattern inspection has a correlation with the supplied amount of the imprint material IM and the recipe for determining the position of the imprint material IM.

Further, the CD inspection for inspecting the accuracy of the line width and the like of the pattern and the electrical characteristics inspection for inspecting the accuracy of the electrical characteristics of semiconductor devices or the like manufactured from the substrate on which the pattern is formed, have a correlation with the apparatus information acquired by the imprint apparatus IMP.

As described above, the plurality of pieces of information has a correlation with the inspection result. This correlation differs in degree, depending on the condition of the imprint process. Further, the degree differs depending on the mutual affection between the contents of the apparatus information.

Figure 6:
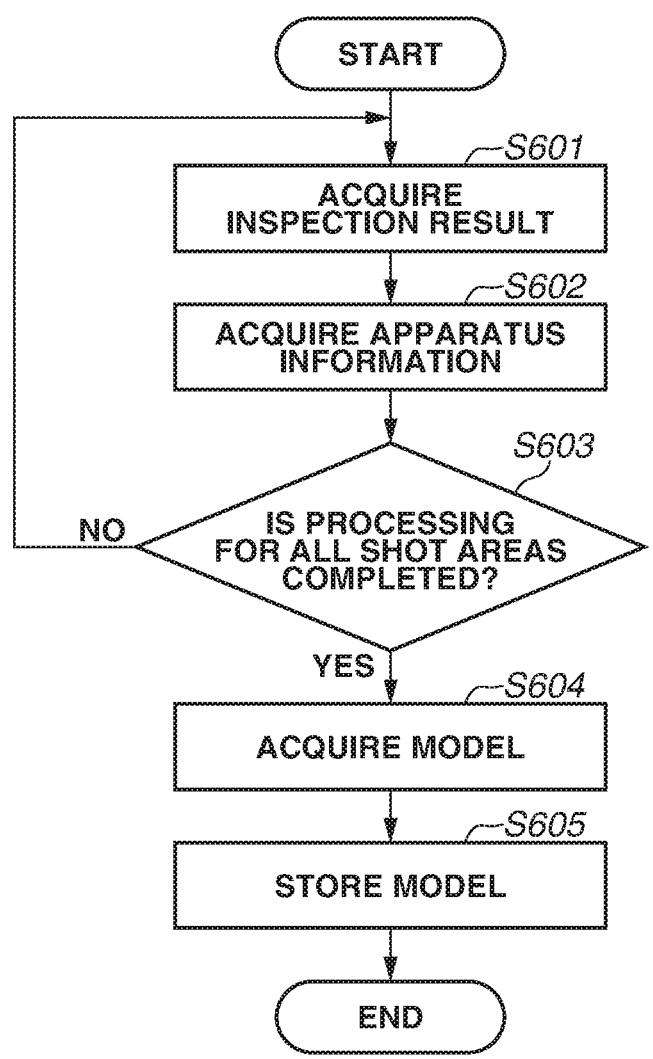
FIG. 6 is a flowchart illustrating a method for acquiring a model for acquiring information indicating inspection conditions.

Next, a method for acquiring, by machine learning, a model for acquiring information indicating inspection conditions from the apparatus information will be described. FIG. 6 is a flowchart illustrating the method for acquiring the model for acquiring the information indicating inspection conditions.

In step S601, the acquisition apparatus 303 acquires the result of the inspection on the shot area of the substrate S on which the inspection is performed by the inspection apparatus 301 from the inspection apparatus 301 via the network 304.

In step S602, the acquisition apparatus 303 acquires the apparatus information obtained by the imprint apparatus IMP during execution of the imprint process on the shot area of the substrate S, from the imprint apparatus IMP via the network 304. The apparatus information to be acquired is information acquired in the flowchart illustrated in FIG. 4 for each shot area of the substrate S and is stored in the storage device 204 of the control unit 110.

In step S603, the acquisition apparatus 303 determines whether the processing of steps S601 and S602 is executed on all shot areas of the substrate S. If the control unit 110 determines that the processing of steps S601 and S602 is executed on all shot areas (YES in step S603), the processing proceeds to step S604. If there is an unprocessed shot area (NO in step S603), the processing returns to step S601. If there is another inspection result and apparatus information to be acquired for the plurality of substrates S, the processing of steps S601 to S603 is repeatedly performed on all shot areas of the plurality of substrates S. In addition, inspection results and apparatus information about the plurality of substrates S on which the imprint process has been performed under a plurality of conditions should be prepared.

In step S604, the acquisition apparatus 303 learns, as learning data, the relationship between the inspection conditions obtained based on the inspection result acquired in step S601 and the apparatus information acquired in step S602, and acquires a model for acquiring the information indicating the inspection conditions. In this case, the information indicating the inspection conditions is obtained so as to include the inspection that is determined to be necessary based on the inspection result. For example, the acquired inspection result is compared with a predetermined threshold to obtain the substrate S to be inspected, the shot area to be inspected, the level at which the inspection is performed, or the like. For example, when a positional deviation of the pattern formed on the 30th shot area on the substrate S is larger than the predetermined threshold, the inspection condition that the overlay inspection is performed on the 30th shot area on the substrate S is obtained. The acquired model is, for example, a model in which internal random variables are optimized using an algorithm, such as an error back propagation algorithm, in a neural network including multilayer perceptrons. The apparatus information acquired during the imprint process on a new substrate is input to the acquired model, so that information indicating inspection conditions for the new substrate can be acquired. When the apparatus information acquired by the imprint apparatus IMP includes image information such as an alignment image or a spread image, a convolution neural network may be preferably used. When the apparatus information acquired by the imprint apparatus IMP includes time-series information, a recurrent neural network may be preferably used. When the number of pieces of learning data is small, a support vector machine may be preferably used. The acquisition apparatus 303 may learn, as learning data, the relationship between the inspection result (fourth information) acquired in step S601 and the apparatus information acquired in step S602 to acquire a model for acquiring information about the inspection result. In this case, as described below, the acquisition apparatus 303 determines the inspection conditions under which the inspection is performed by a method similar to the method for acquiring the information indicating the inspection conditions described above in step S604 from the acquired information about the inspection result.

In step S605, the acquisition apparatus 303 stores information about the model acquired in step S604 in the storage device of the acquisition apparatus 303. In this case, the information about the model can include information about the number of layers of perceptrons, information indicating the structure of the neural network such as the number of neurons, and information about optimized random variables.

Figure 7:
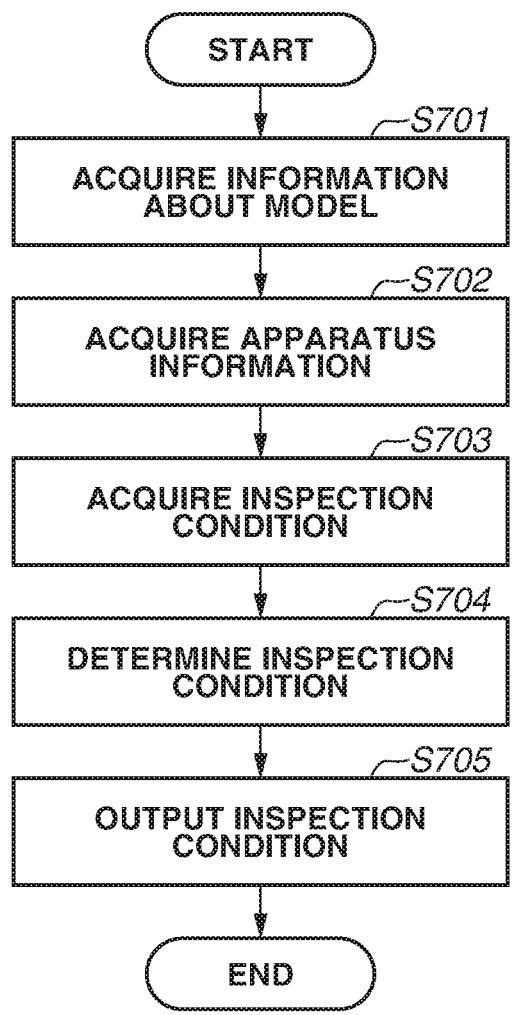
FIG. 7 is a flowchart illustrating a method for acquiring inspection conditions by using the model.

Next, a method for acquiring inspection conditions using the model acquired by the acquisition apparatus 303 will be described with reference to FIG. 7. FIG. 7 is a flowchart illustrating the method for acquiring inspection conditions using the model.

In step S701, the acquisition apparatus 303 acquires the information about the model stored in step S605. In this case, the information about the model can include information about the number of layers of perceptrons, information indicating the structure of the neural network such as the number of neurons, and information about optimized random variables.

In step S702, the acquisition apparatus 303 acquires the apparatus information acquired by the imprint apparatus IMP via the network 304. The apparatus information to be acquired is information (third information) that is similar to the apparatus information acquired in step S602. The third information is newly acquired by the imprint apparatus IMP. In this case, the imprint apparatus IMP may output the acquired apparatus information to the acquisition apparatus 303 in response to a request from the acquisition apparatus 303, or may output the apparatus information to the acquisition apparatus 303 when the apparatus information is acquired during the imprint process. Alternatively, the imprint apparatus IMP may output the apparatus information for each shot area, or the apparatus information for each substrate or information for a plurality of substrates collectively.

In step S703, the acquisition apparatus 303 acquires information indicating the inspection conditions for the inspection apparatus 301 by using the information about the model acquired in step S701 and the apparatus information acquired in step S702. Next, in step S704, the acquisition apparatus 303 determines the inspection conditions based on the acquired information indicating the inspection conditions. Next, in step S705, the determined inspection conditions are output to the inspection apparatus 301. Then, the inspection apparatus 301 performs an inspection on the substrate S by applying the inspection conditions output in step S705.

In the case of acquiring the model for acquiring the information about the inspection result, in step S703, the information about the inspection result is acquired using the information about the model acquired in step S701 and the apparatus information acquired in step S702. Next, in step S704, the acquisition apparatus 303 determines the inspection conditions based on the acquired information about the inspection result. As described above, the acquisition apparatus 303 determines the inspection conditions under which the inspection is performed by a method similar to the method for acquiring the information indicating the inspection conditions described above in step S604 from the acquired information about the inspection result. In this case, the acquisition apparatus 303 may calculate a statistic indicating a variation or the like for each substrate from the inspection result acquired from the model, and may determine whether to adopt the inspection conditions determined based on the calculated statistic. Further, in step S705, at least one of the inspection result acquired from the model and the calculated statistic may be output to the inspection apparatus 301.

While the present exemplary embodiment illustrates the method in which the acquisition apparatus 303 acquires the model for acquiring the inspection result to determine the inspection conditions, the present invention is not limited to the case where the acquisition apparatus 303 executes this processing. For example, the control apparatus 305 may acquire the model to determine the inspection conditions. Alternatively, the control unit of the inspection apparatus 301 may acquire the model to determine the inspection conditions. Further alternatively, the model may be acquired to determine the inspection conditions by using a combination of some of the acquisition apparatus 303, the control apparatus 305, and the control unit of the inspection apparatus 301. For example, the acquisition apparatus 303 may acquire the model and output information about the acquired model to the control unit of the inspection apparatus 301, and the control unit of the inspection apparatus 301 may determine the inspection conditions using the model.

As described above, according to the present exemplary embodiment, the information indicating inspection conditions is acquired from the model obtained by the learning using the apparatus information acquired during the imprint process and the inspection conditions for the substrate, thereby making it possible to determine the inspection conditions for performing an inspection on the pattern formed on the substrate.

(Article Manufacturing Method)

Figure 9:
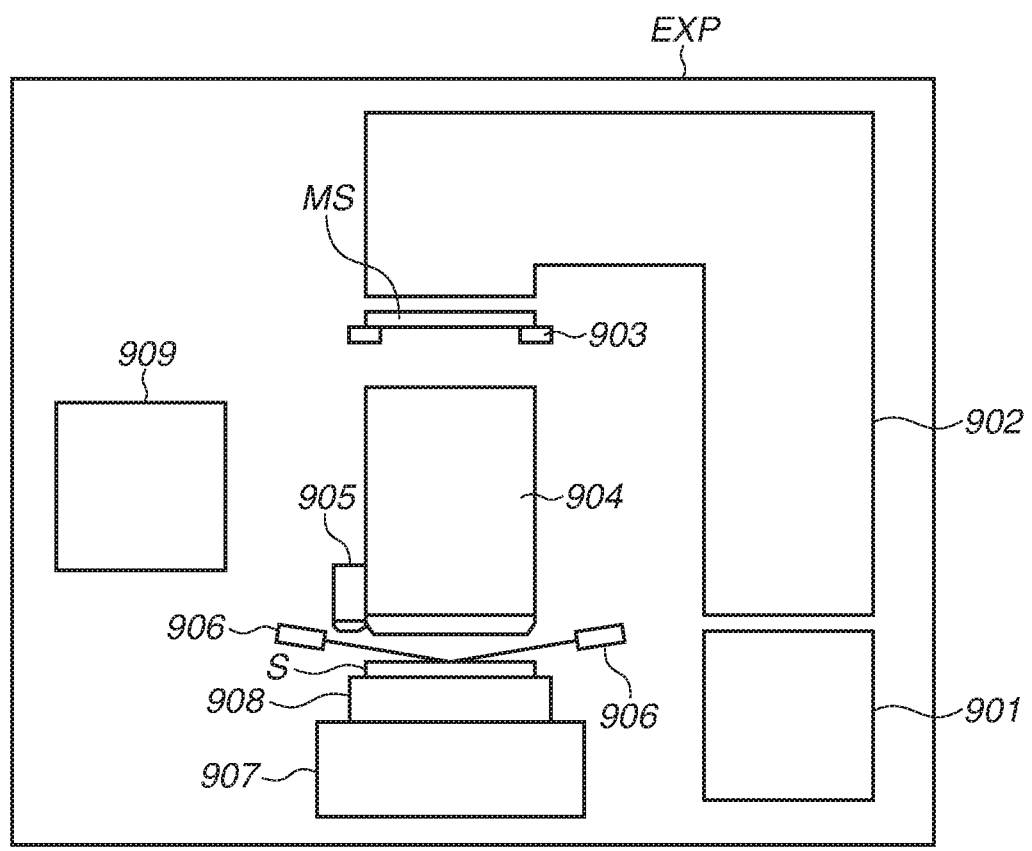
FIG. 9 illustrates an exposure apparatus.

An article manufacturing method according to the present exemplary embodiment will be described. FIG. 9 illustrates the article manufacturing method according to the present exemplary embodiment. A pattern of a cured product formed by using the imprint apparatus IMP is permanently used for at least a part of various articles, or is temporarily used when various articles are manufactured. Examples of articles include an electric circuit element, an optical element, MEMS, a recording element, a sensor, and a mold. Examples of the electric circuit element include volatile or nonvolatile semiconductor memories, such as a dynamic RAM (DRAM), a static RAM (SRAM), a flash memory, and a magnetic RAM (MRAM), and semiconductor devices such as a large-scale integration (LSI), a charge-coupled device (CCD), an image sensor, and an FPGA. Examples of the mold include a mold for imprinting.

The pattern of the cured product is used as a component of at least a part of the article as it is, or is temporarily used as a resist mask. The resist mask is removed after etching, ion implantation, or the like is performed in a substrate processing step.

Figure 8A:
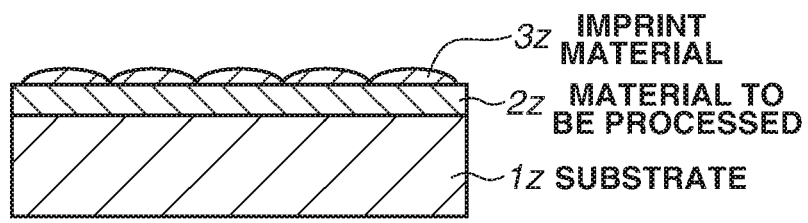
FIGS. 8A to 8F each illustrate an article manufacturing method according to a first exemplary embodiment.

Next, a specific article manufacturing method will be described. As illustrated in FIG. 8A, a substrate $1z$ such as a silicon substrate, on which a material to be processed $2z$ such as an insulating material, is formed is prepared, and then, an imprint material $3z$ is applied onto the surface of the material to be processed $2z$ by the inkjet method or the like. FIG. 8A illustrates a state where the imprint material $3z$ in the form of a plurality of droplets is applied onto the substrate $1z$.

Figure 8B:
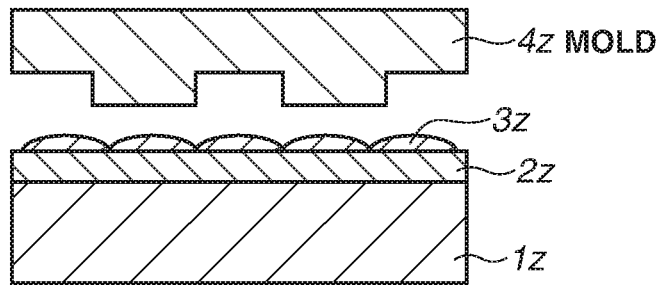
Figure 8C:
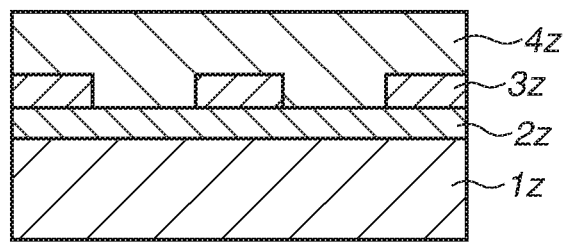

As illustrated in FIG. 8B, a mold $4z$ for imprinting is opposed to the imprint material $3z$ above the substrate $1z$. A side of the mold $4z$ on which a concave-convex pattern is formed is directed to the imprint material $3z$. As illustrated in FIG. 8C, the substrate $1z$ to which the imprint material $3z$ is applied and the mold $4z$ are brought into contact and a pressure is applied thereto. The A space between the mold $4z$ and the processed material $2z$ is filled in with the imprint material $3z$. If the imprint material $3z$ is irradiated in this state with light serving as curing energy through the mold $4z$, the imprint material $3z$ is cured.

Figure 8D:
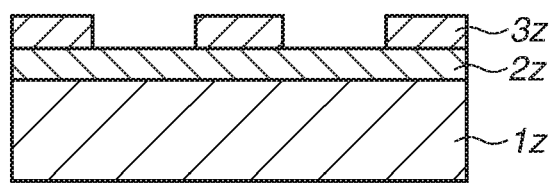

As illustrated in FIG. 8D, when the mold $4z$ and the substrate $1z$ are separated after the imprint material $3z$ is cured, a pattern of a cured product of the imprint material $3z$ is formed above the substrate 1z. The pattern of the cured product has a shape in which a concave portion of the mold corresponds to a convex portion of the cured product and a convex portion of the mold corresponds to a concave portion of the cured product. That is, the concave-convex pattern of the mold 4z is transferred to the imprint material 3z.

Figure 8E:
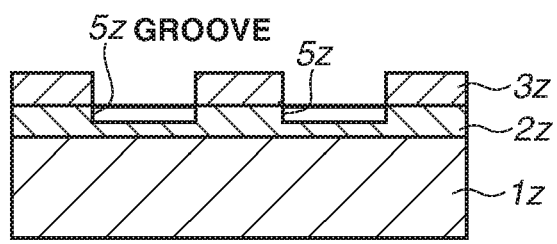
Figure 8F:
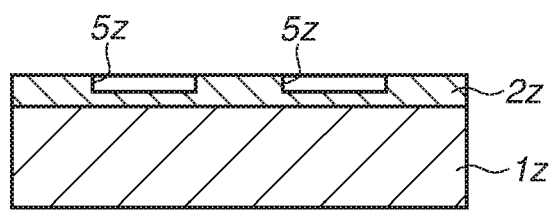

As illustrated in FIG. 8E, when etching is performed using the pattern of the cured product as an etching resistant mask, the surface of the processed material 2z where there is no cured product or where there is a thin residual film of the cured product is removed to form grooves 5z. As illustrated in FIG. 8F, when the pattern of the cured product is removed, an article with the grooves 5z formed on the surface of the processed material 2z can be obtained. In this case, the pattern of the cured product is removed. However, the pattern of the cured product may be used as, for example, a film for interlayer insulation included in semiconductor devices, that is, as a component of the article, instead of removing the pattern of the cured product after processing.

A second exemplary embodiment will be described below. The present exemplary embodiment illustrates an example in which the exposure apparatus is used as the lithography apparatus. Matters that are not described in the present exemplary embodiment can follow the description of the first exemplary embodiment. FIG. 9 illustrates an exposure apparatus. An exposure apparatus EXP is configured to irradiate an original having a pattern portion formed thereon with light and projects a pattern to each shot area on the substrate S using the light from the original. The exposure apparatus EXP can include a light source unit 901, an illumination optical system 902, a mask stage 903 (moving portion), a projection optical system 904, a substrate stage 907 (moving portion), and a substrate chuck 908 (substrate holding portion).

Light output from the light source unit 901 illuminates a mask MS (original) held on the mask stage 903 through the illumination optical system 902. Examples of a light source of the light source unit 901 include a high pressure mercury lamp and an excimer laser. When an excimer laser is used as the light source, the light source unit 901 is not necessarily provided in the chamber of the exposure apparatus EXP, but instead may be provided on the outside of the chamber of the exposure apparatus EXP. The mask MS is provided with a pattern to be transferred thereto. Light illuminating the mask MS passes through the projection optical system 904 and reaches the substrate S. Examples of the substrate S include a silicon wafer, a glass plate, and a film-like substrate.

The pattern on the mask MS is transferred to a photosensitive medium (e.g., resist), which is coated on the substrate S, through the projection optical system 904. The substrate S is held on the substrate chuck 908 in a state where the substrate S is corrected to be flat by means of vacuum suction or the like. The substrate chuck 908 includes a suction unit (not illustrated) for holding the substrate S. As a method for sucking the substrate S with the suction unit, a vacuum suction method, an electrostatic suction method, or other suction methods can be used. Further, the suction unit can include a plurality of suction pads (suction portions) which are arranged on a holding surface of the substrate chuck 908 on which the substrate S is held. The substrate chuck 908 is held on the substrate stage 907. The substrate stage 907 is configured to be movable. While the substrate stage 907 two-dimensionally moves in a stepwise manner along the surface vertical to the optical axis of the projection optical system 904, a plurality of shot areas on the substrate S is repeatedly exposed to light. This exposure method is called a step-and-repeat method. In addition, an exposure method in which scanning and exposure are performed by synchronizing the mask stage 903 with the substrate stage 907 is called a step-and-scanning method. The present exemplary embodiment is also applicable to an exposure apparatus that employs the step-and-scanning method.

Further, the projection optical system 904 can include a pattern deforming unit that deforms a relative shape of a pattern with respect to each shot area. The exposure apparatus that employs the step-and-scanning method can include a trajectory changing unit that controls the trajectory of each stage being scanned (e.g., each stage is scanned while being shifted in the direction perpendicular to a scanning direction), thereby deforming the relative shape of the pattern with respect to each shot area.

The exposure apparatus EXP can also include a control portion 909, an alignment measurement portion 905, and a focus measurement portion 906. The control portion 909 controls the operation, adjustment, and the like of each unit of the exposure apparatus EXP, thereby controlling an exposure process for forming a pattern on the substrate S. The configuration of the control portion 909 is similar to the control unit 110 according to the first exemplary embodiment, and can be configured using, for example, the information processing apparatus illustrated in FIG. 2.

The alignment measurement portion 905 measures the position of each alignment mark (not illustrated) on the substrate S. The control portion 909 processes a signal from the alignment measurement portion 905 and calculates a driving amount of at least one of the substrate stage 907 and the mask stage 903 used to perform an alignment between the mask MS and the substrate S. Further, the control portion 909 drives at least one of the mask stage 903 and the substrate stage 907 and controls the exposure to be performed while aligning the mask MS with the substrate S. Alternatively, the alignment may be controlled in such a manner that relative shapes of the pattern on each shot area are coordinated with each other by the pattern deforming unit or the trajectory changing unit described above. Information about the position of each alignment mark measured by the alignment measurement portion 905 is referred to as an alignment measured value. The alignment measured value can include the position of each alignment mark and a relative position between alignment marks. The image captured by the alignment measurement portion 905 is referred to as an alignment image.

The focus measurement portion 906 measures the height of the substrate S at a plurality of measurement points within an area which is irradiated with the light from the projection optical system 904. In the focus measurement portion 906, the arrangement of the plurality of measurement points is fixed within the area which is irradiated with the light from the projection optical system 904, and the height of the substrate S is measured at each of measurement points. Further, the focus measurement portion 906 includes a plurality of optical sensors of an oblique incidence type that receive the light which is obliquely incident and reflected on the substrate S, so that the plurality of optical sensors measures the height of the substrate S at a plurality of measurement points. Thus, the control portion 909 calculates the driving amount of the substrate stage 907 to perform an alignment of at least one of the height and inclination of the substrate S based on the result of measuring the height of the substrate S at the plurality of measurement points. The control portion 909 drives the substrate stage 907 and controls the exposure by performing an alignment of at least one of the height and inclination of the substrate S. While the focus measurement portion 906 is configured so as to include optical sensors for causing the light to be obliquely incident on the substrate S, the configuration of the focus measurement portion 906 is not limited thereto. The focus measurement portion 906 may be configured to include sensors such as an electrostatic capacitance sensor and a pressure sensor.

In the present exemplary embodiment, the exposure apparatus acquires the information related to the inspection conditions from the apparatus information acquired during the exposure process and determines the inspection conditions. FIG. 10 is a flowchart illustrating the exposure process. First, in step S1001, the control portion 909 controls the substrate conveying mechanism (not illustrated) to load the substrate S into the substrate chuck 908. Then, the control portion 909 stores, in the storage device 204, information about a distribution of the suction force controlled for each of suction pads in the substrate chuck 908 as the apparatus information.

In step S1002, the control portion 909 controls the alignment measurement portion 905 to measure each alignment mark. Further, the control portion 909 controls the substrate stage 907 to move in order to perform the alignment until a relative position of each of the shot area on the substrate S and the area which is irradiated with the light from the projection optical system 904 falls within an allowable range of a target relative position. The control portion 909 may control the mask stage 903 to move in order to perform the alignment, or may control the mask stage 903 and the substrate stage 907 to move to perform the alignment. Further, in the control processing, the alignment may be made in such a manner that relative shapes of the pattern with respect to each shot area are coordinated by the pattern deforming unit or the trajectory changing unit described above. Then, the control portion 909 stores, in the storage device 204, information about the alignment control value and the alignment image as the apparatus information. Further, the control portion 909 stores, in the storage device 204, the position of the shot area on which the exposure process is executed as the apparatus information. Furthermore, the control portion 909 controls a stage measurement portion (not illustrated) to measure a vibration generated due to the movement of the substrate stage 907. Then, the control portion 909 stores, in the storage device 204, stage measurement information obtained through the measurement as the apparatus information. The stage measurement information can include a statistic related to the vibration generated in the substrate stage 907, and time-series information.

In step S1003, the control portion 909 controls the focus measurement portion 906 to measure the height of the substrate S and move the substrate stage 907 to move each shot area to a focus position of the projection optical system 904. Further, the control portion 909 stores, in the storage device 204, a focus value obtained through the measurement performed by the focus measurement portion 906 as the apparatus information.

In step S1004, the control portion 909 controls the light source unit 901, the illumination optical system 902, the projection optical system 904 and the like and performs the exposure by irradiating each shot area on the substrate S with light. Further, the control portion 909 causes an exposure amount measurement portion (not illustrated) to measure the exposure amount, and stores information about the measured exposure amount as the apparatus information in the storage device 204. As the information about the exposure amount, information about an accumulated exposure amount which is exposure amounts accumulated from the start of the exposure may be used. The control portion 909 stores, in the storage device 204, an exposure time which is a time required for performing the exposure by irradiating each shot area with light, as the apparatus information.

Further, the apparatus information such as information about a distribution of the suction force may be information obtained at a certain point of time, or time-series information in a certain period.

In step S1005, the control portion 909 determines whether the exposure processing for all shot areas on the substrate S is completed. If the control portion 909 determines that the exposure processing for all shot areas on the substrate S is not completed (NO in step S1005), the processing returns to step S1002 and the control portion 909 controls the exposure processing to be performed on the subsequent shot area. If the control portion 909 determines that the exposure processing for all shot areas on the substrate S is completed (YES in step S1005), the processing proceeds to step S1006.

In this case, the inspection result about the pattern formed on the substrate S by performing the exposure process has a correlation with a plurality of pieces of apparatus information acquired by the exposure apparatus EXP. For example, the inspection result of the overlay inspection is affected by the alignment between the shot area on the substrate S and the irradiation area of light from the projection optical system 904. Therefore, the inspection result of the overlay inspection has a correlation with the alignment measured value measured by the alignment measurement portion 905 and the stage measurement information measured by the stage measurement portion.

Further, the inspection result of the CD inspection about the pattern formed on the substrate S by performing the exposure process is affected by the exposure amount, exposure time, and focus position. Therefore, the inspection result of the CD inspection has a correlation with the exposure amount and exposure time at the exposure time of the shot area, and the focus measured value measured by the focus measurement portion 906.

Further, the inspection result of the pattern inspection about the pattern formed on the substrate S by performing the exposure process and the electrical characteristics inspection for inspecting the accuracy of the electrical characteristics of the semiconductor devices and the like manufactured from the substrate on which the pattern is formed, have a correlation with the apparatus information acquired by the exposure apparatus EXP.

As described above, the plurality of pieces of information has a correlation with the inspection result. This correlation differs in degree, depending on the condition of the exposure process. Further, the degree differs depending on the mutual affection between the contents of the apparatus information.

In step S1006, the control portion 909 controls the substrate conveying mechanism (not illustrated) to unload the substrate S from the substrate chuck 908.

Further, as in the first exemplary embodiment, the acquisition apparatus 303 acquires information indicating the inspection conditions acquired from the apparatus information acquired during the exposure processing and determines the inspection conditions. Furthermore, as in the first exemplary embodiment, the substrate S on which the exposure processing has been performed and the pattern has been formed is conveyed to the inspection apparatus 301, and the inspection apparatus 301 performs an inspection on the substrate S on which the exposure processing has been performed by applying the determined inspection conditions.

Moreover, as in the first exemplary embodiment, the acquisition apparatus 303 may learn, as learning data, the relationship between the inspection result (fourth information) acquired in step S601 and the apparatus information acquired in step S602, and may acquire a model for acquiring information about the inspection result. In this case, the information about the inspection result is acquired by using the apparatus information acquired in step S702. Next, in step S704, the acquisition apparatus 303 determines the inspection conditions based on the acquired information about the inspection result.

(Article Manufacturing Method)

The article manufacturing method according to the present exemplary embodiment is suitable for manufacturing an article such as a device for a particular purpose (e.g., a semiconductor device, a magnetic storage medium, or a liquid crystal display device). The manufacturing method includes a process of exposing a substrate on which photoresist is coated with light (forming a pattern on a substrate) by using the exposure apparatus EXP, and a process of developing the substrate exposed to light (processing the substrate). In addition, the manufacturing method can include other known processes (oxidation, film formation, deposition, doping, planarization, etching, resist removal, dicing, bonding, packaging, and the like). The article manufacturing method according to the present exemplary embodiment is more advantageous than the related art in regard to at least one of the performance, quality, productivity, and production cost of the article.

Preferred exemplary embodiments of the present invention have been described above. However, the present invention is not limited to the exemplary embodiments and can be modified or changed in various manners within the scope of the invention. While the imprint apparatus and the exposure apparatus are illustrated as examples of the lithography apparatus in the exemplary embodiments described above, the lithography apparatus is not limited to these examples.

As another example of the lithography apparatus, an apparatus such as a drawing apparatus for forming a pattern on a substrate with charged particle beams (electron beams, ion beams, or the like) via a charged particle optical system may be used. Other examples of the lithography apparatus can include manufacturing apparatuses, such as a coating apparatus that coats a photosensitive medium on the surface of a substrate and a developing apparatus that develops the substrate onto which a pattern is transferred. Such manufacturing apparatuses can carry out processes other than the processes to be performed by an apparatus such as the imprint apparatus as described above in manufacturing an article like a device.

The first and second exemplary embodiments can be carried out singly or in combination.

According to aspects of the present invention, it is possible to provide an information processing apparatus, a program, a lithography apparatus, a lithography system, and an article manufacturing method which are configured to acquire inspection conditions for performing an inspection on a pattern formed on a substrate.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-125523, filed Jun. 29, 2018, and No. 2019-097148, filed May 23, 2019, which are hereby incorporated by reference herein in their entirety.

What is claimed is:

1. An information processing apparatus for acquiring an inspection condition for performing an inspection on a pattern formed by a lithography apparatus that forms a pattern on a substrate with an original, the information processing apparatus comprising:
    an acquisition unit configured to acquire a second inspection condition output from a model to be applied in a case where an inspection is performed on a second pattern by inputting third information indicating a state of the lithography apparatus acquired when the second pattern is formed to the model,
    wherein the model is acquired by machine learning with learning data including first information indicating a state of the lithography apparatus acquired when a first pattern is formed and second information indicating a first inspection condition applied when an inspection is performed on the first pattern,
    wherein the model outputs information indicating the second inspection condition to be applied in the case where the inspection is performed on the second pattern by inputting the third information indicating the state of the lithography apparatus acquired when the second pattern is formed.

2. The information processing apparatus according to claim 1, further comprising an output unit configured to output the second inspection condition to an inspection apparatus configured to perform an inspection on a pattern formed on a substrate.

3. An information processing apparatus for acquiring an inspection condition for performing an inspection on a pattern formed by a lithography apparatus that forms a pattern on a substrate with an original, the information processing apparatus comprising:
    an acquisition unit configured to acquire a second inspection result, output from a model, of an inspection on a second pattern by inputting third information indicating a state of the lithography apparatus acquired when the second pattern is formed to the model; and a determination unit configured to determine a second inspection condition to be applied in a case where an inspection is performed on the second pattern based on the second inspection result acquired by the acquisition unit, wherein the model is acquired by machine learning with learning data including first information indicating a state of the lithography apparatus acquired when a first pattern is formed and fourth information related to a first inspection result acquired by performing an inspection on the first pattern, wherein the model outputs the second inspection result of the inspection on the second pattern by inputting the third information indicating the state of the lithography apparatus acquired when the second pattern is formed.

4. The information processing apparatus according to claim 3, further comprising an output unit configured to output at least one of the second inspection result and the second inspection condition to an inspection apparatus configured to perform an inspection on a pattern formed on a substrate.

5. The information processing apparatus according to claim 3, further comprising:

a calculation unit configured to calculate a statistic for each of the substrates based on the second inspection result acquired by the acquisition unit; and a determination unit configured to determine whether to adopt the second inspection condition based on the statistic calculated by the calculation unit.

6. The information processing apparatus according to claim 5, further comprising an output unit configured to output the statistic to an inspection apparatus configured to perform an inspection on a pattern formed on a substrate.

7. The information processing apparatus according to claim 1, wherein the first information and the third information include information about a command value for controlling a moving portion configured to move at least one of the original and the substrate in the lithography apparatus.

8. The information processing apparatus according to claim 1, wherein the first information and the third information include information about a distribution of a suction force in a plurality of suction portions provided on a substrate holding portion configured to hold the substrate in the lithography apparatus.

9. The information processing apparatus according to claim 1, wherein the first information and the third information include at least one of information about an alignment image and an alignment measured value obtained by measuring an alignment mark formed on at least one of the original and the substrate in the lithography apparatus.

10. The information processing apparatus according to claim 1, wherein the lithography apparatus is an imprint apparatus configured to bring a pattern portion of an original and an imprint material on a substrate into contact to form a pattern, and wherein the first information and the third information include at least one of information about a drop recipe to determine a supply amount of the imprint material and a position where the imprint material is supplied, information about a pressing force acting on the original when the imprint material and the pattern of the original are brought into contact, information about a pressure in a space between a concave portion of the original and a mold holding portion configured to hold the original, information about a captured image of the imprint material having contacted the pattern of the original, information about a shear force acting between the original and the substrate when the imprint material and the pattern of the original are brought into contact, and information about a releasing force required for separating the imprint material from the pattern of the original.

11. The information processing apparatus according to claim 10, wherein the information about the pressing force includes information about a distribution of a pressing force acting on a plurality of positions of the original.

12. The information processing apparatus according to claim 10, wherein the information about the releasing force includes information about a distribution of a releasing force acting on a plurality of positions of the original.

13. The information processing apparatus according to claim 1, wherein the lithography apparatus is an exposure apparatus configured to expose a substrate to light to form a pattern, and wherein the first information and the third information include at least one of a focus measured value obtained by measuring a height of the substrate, measurement information obtained by measuring a vibration of a substrate stage configured to hold the substrate, an exposure amount obtained by measuring an amount of light for exposure of the substrate, and information about an exposure time indicating a time for exposing the substrate to light.

14. The information processing apparatus according to claim 1, wherein the first pattern is a pattern formed on a first shot area of a first substrate as the substrate, and wherein the second inspection condition to be applied in a case where an inspection is performed on the second pattern is acquired from the third information acquired when the second pattern is formed on a second shot area on a second substrate as the substrate.

15. The information processing apparatus according to claim 1, wherein the first pattern is a pattern formed on a first shot area of a first substrate as the substrate, and wherein a third inspection condition to be applied in a case where an inspection is performed on a third pattern is further acquired from the third information acquired when the second pattern is formed on a second shot area of a second substrate as the substrate, the third pattern being formed on a third shot area different from the second shot area.

16. The information processing apparatus according to claim 15, wherein the third shot area is located on the same substrate as the second shot area is located.

17. The information processing apparatus according to claim 15, wherein the third shot area is located on a substrate different from the substrate on which the second shot area is located.

18. The information processing apparatus according to claim 17, wherein a position of the third shot area on the substrate is identical to a position of the second shot area on the substrate.

19. An information processing apparatus for acquiring a model for acquiring an inspection condition for performing an inspection on a pattern formed by a lithography apparatus that forms a pattern on a substrate with an original, the information processing apparatus comprising:

an acquisition unit configured to acquire a model for acquiring a second inspection condition output from the model to be applied in a case where an inspection is performed on a second pattern by inputting third information indicating a state of the lithography apparatus acquired when the second pattern is formed to the model, wherein the model is acquired by machine learning with learning data including first information indicating a state of the lithography apparatus acquired when a first pattern is formed and second information indicating a first inspection condition applied when an inspection is performed on the first pattern, wherein the model outputs information indicating the second inspection condition to be applied in the case where the inspection is performed on the second pattern by inputting the third information indicating the state of lithography apparatus acquired when the second pattern is formed.

20. An information processing apparatus for acquiring a model for acquiring an inspection result of an inspection on a pattern formed by a lithography apparatus that forms a pattern on a substrate with an original, the information processing apparatus comprising:

an acquisition unit configured to acquire a model for acquiring a second inspection result output from the model acquired by performing an inspection on a second pattern by inputting third information indicating a state of the lithography apparatus acquired when the second pattern is formed to the model, wherein the model is acquired by machine learning with learning data including first information indicating a state of the lithography apparatus acquired when a first pattern is formed and fourth information related to a first inspection result acquired by performing an inspection on the first pattern, wherein the model outputs the second inspection result of the inspection on the second pattern by inputting the third information indicating the state of the lithography apparatus acquired when the second pattern is formed.

21. A non-transitory computer-readable storage medium storing a program for causing a computer to acquire an inspection condition for performing an inspection on a pattern formed by a lithography apparatus that forms a pattern on a substrate with an original, the program causing the computer to execute an acquisition method including an acquisition unit configured to acquire a second inspection condition output from a model to be applied in a case where an inspection is performed on a second pattern by inputting third information indicating a state of the lithography apparatus acquired when the second pattern is formed to the model, wherein the model is acquired by machine learning with learning data including first information indicating a state of the lithography apparatus acquired when a first pattern is formed and second information indicating a first inspection condition applied when an inspection is performed on the first pattern, wherein the model outputs information indicating the second inspection condition to be applied in the case where the inspection is performed on the second pattern by inputting the third information indicating the state of the lithography apparatus acquired when the second pattern is formed.

22. A non-transitory computer-readable storage medium storing a program for causing a computer to acquire a model for acquiring an inspection condition for performing an inspection on a pattern formed by a lithography apparatus that forms a pattern on a substrate with an original, the program causing the computer to execute an acquisition method including an acquisition unit configured to acquire a model for acquiring a second inspection condition output from the model to be applied in a case where an inspection is performed on a second pattern by inputting third information indicating a state of the lithography apparatus acquired when the second pattern is formed to the model, wherein the model is acquiring by machine learning with learning data including first information indicating a state of the lithography apparatus acquired when a first pattern is formed and second information indicating a first inspection condition applied when an inspection is performed on the first pattern, wherein the model outputs information indicating the second inspection condition to be applied in the case where the inspection is performed on the second pattern by inputting the third information indicating the state of the lithography apparatus acquired when the second pattern is formed.

23. A non-transitory computer-readable storage medium storing a program for causing a computer to acquire a model for acquiring an inspection result of an inspection on a pattern formed by a lithography apparatus that forms a pattern on a substrate with an original, the program causing the computer to execute an acquisition method including an acquisition unit configured to acquire a second inspection result output from a model acquired by performing an inspection on a second pattern by inputting third information indicating a state of the lithography apparatus acquired when the second pattern is formed to the model, wherein the model is acquired by machine learning with learning data including first information indicating a state of the lithography apparatus acquired when a first pattern is formed and fourth information related to a first inspection result acquired by performing an inspection on the first pattern, wherein the model outputs the second inspection result of the inspection on the second pattern by inputting the third information indicating the state of the lithography apparatus acquired when the second pattern is formed.

24. A lithography apparatus for forming a pattern on a substrate with an original, the lithography apparatus comprising:

an information processing apparatus configured to acquire an inspection condition for performing an inspection on a pattern formed by the lithography apparatus that forms a pattern on a substrate with an original, wherein the information processing apparatus includes an acquisition unit configured to acquire a second inspection condition output from a model to be applied in a case where an inspection is performed on a second pattern by inputting third information indicating a state of the lithography apparatus acquired when the second pattern is formed to the model, wherein the model is acquired by machine learning with learning data including first information indicating a state of the lithography apparatus acquired when a first pattern is formed and second information indicating a first inspection condition applied when an inspection is performed on the first pattern, and wherein a pattern is formed on the substrate to acquire the second inspection condition, wherein the model outputs information indicating the second inspection condition to be applied in the case where the inspection is performed on the second pattern by inputting the third information indicating the state of the lithography apparatus acquired when the second pattern is formed.

25. An article manufacturing method for manufacturing an article from a substrate on which processes are performed, the processes comprising:
a first process of forming a pattern on a substrate by a lithography apparatus configured to form a pattern on a substrate with an original, the lithography apparatus comprising an information processing apparatus configured to acquire an inspection condition for performing an inspection on a pattern formed by the lithography apparatus configured to form a pattern on a substrate with an original, the information processing apparatus comprising an acquisition unit configured to acquire a second inspection condition output from a model to be applied in a case where an inspection is performed on a second pattern by inputting third information indicating a state of the lithography apparatus acquired when the second pattern is formed to the model,
wherein the model is acquired by machine learning with learning data including first information indicating a state of the lithography apparatus acquired when a first pattern is formed and second information indicating a first inspection condition applied when an inspection is performed on the first pattern, and
wherein the lithography apparatus is configured to acquire the second inspection condition in the first process; and
a second process of processing the substrate on which the pattern is formed in the first process,
wherein the model outputs information indicating the second inspection condition to be applied in the case where the inspection is performed on the second pattern by inputting the third information indicating the state of the lithography apparatus acquired when the second pattern is formed.

26. A lithography system comprising:
a lithography apparatus configured to form a pattern on a substrate with an original; and
an information processing apparatus configured to acquire an inspection condition for performing an inspection on the pattern formed by the lithography apparatus,
wherein the information processing apparatus comprises an acquisition unit configured to acquire a second inspection condition output from a model to be applied in a case where an inspection is performed on a second pattern by inputting third information indicating a state of the lithography apparatus acquired when the second pattern is formed to the model,
wherein the model is acquired by machine learning with learning data including first information indicating a state of the lithography apparatus acquired when a first pattern is formed and second information indicating a first inspection condition applied when an inspection is performed on the first pattern, and
wherein in the lithography apparatus, a pattern is formed on the substrate, and the acquisition unit in the information processing apparatus acquires an inspection condition to be applied in a case where an inspection is performed on the pattern,
wherein the model outputs information indicating the second inspection condition to be applied in the case where the inspection is performed on the second pattern by inputting the third information indicating the state of the lithography apparatus acquired when the second pattern is formed.

27. An article manufacturing method for manufacturing an article from a substrate on which processes are performed, the processes comprising:
a first process of forming a pattern on a substrate by a lithography system configured to form a pattern on a substrate with an original, the lithography system comprising a lithography apparatus configured to form a pattern on a substrate with an original, and an information processing apparatus configured to acquire an inspection condition for performing an inspection on a pattern formed by the lithography apparatus, the information processing apparatus comprising an acquisition unit configured to acquire a second inspection condition output from a model to be applied in a case where an inspection is performed on a second pattern by inputting third information indicating a state of the lithography apparatus acquired when the second pattern is formed to the model,
wherein the model is acquired by machine learning with learning data including first information indicating a state of the lithography apparatus acquired when a first pattern is formed and second information indicating a first inspection condition applied when an inspection is performed on the first pattern,
wherein the lithography system is configured to form a pattern on the substrate in the lithography apparatus, the acquisition unit in the information processing apparatus being configured to acquire an inspection condition to be applied in a case where an inspection is performed on the pattern; and
a second process of processing the substrate on which the pattern is formed in the first process,
wherein the model outputs information indicating the second inspection condition to be applied in the case where the inspection is performed on the second pattern by inputting the third information indicating the state of the lithography apparatus acquired when the second pattern is formed.

* * * * *